US010499502B2

(12) United States Patent
de Kok et al.

(10) Patent No.: US 10,499,502 B2
(45) Date of Patent: Dec. 3, 2019

(54) FLEXIBLE DEVICE MODULE FOR FABRIC LAYER ASSEMBLY AND METHOD FOR PRODUCTION

(71) Applicant: Nederlandse Organisatie voor toegepast-natuurwetenschappelijk onderzoek TNO, 's-Gravenhage (NL)

(72) Inventors: Margaretha Maria de Kok, 's-Gravenhage (NL); Gerardus Titus van Heck, 's-Gravenhage (NL); Jeroen van den Brand, 's-Gravenhage (NL); Arachchige Tharindu Niroshan Athauda, Colombo (LK); Vivek Vashdev Ramchandani, Colombo (LK); Mudiyanselage Praneeth Maheeka Bandara Weerasekara, Colombo (LK)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 15/546,239

(22) PCT Filed: Jan. 26, 2016

(86) PCT No.: PCT/NL2016/050059
§ 371 (c)(1),
(2) Date: Jul. 25, 2017

(87) PCT Pub. No.: WO2016/122317
PCT Pub. Date: Aug. 4, 2016

(65) Prior Publication Data
US 2018/0020541 A1      Jan. 18, 2018

(30) Foreign Application Priority Data

Jan. 27, 2015    (EP) .................................... 15152661

(51) Int. Cl.
*H05K 1/03*     (2006.01)
*H01R 12/77*    (2011.01)
(Continued)

(52) U.S. Cl.
CPC ............. *H05K 1/038* (2013.01); *H01R 12/77* (2013.01); *H05K 1/189* (2013.01); *H05K 3/365* (2013.01);
(Continued)

(58) Field of Classification Search
CPC ........ H05K 1/038; H05K 1/189; H05K 3/365; H05K 2201/0129; H05K 2201/0281;
(Continued)

(56) References Cited

U.S. PATENT DOCUMENTS 4,094,572 A  *  6/1978  Burr ......................... H01R 9/20
                                                              439/400
4,640,981 A      2/1987  Dery et al.
(Continued)

FOREIGN PATENT DOCUMENTS

FR            2550683         2/1985
WO    WO 2006/129246 A2    12/2006
(Continued)

OTHER PUBLICATIONS

European Patent Office, International Search Report in International Application No. PCT/NL2016/050059 dated Jun. 6, 2016 (3 pages).

*Primary Examiner* — Steven T Sawyer
*Assistant Examiner* — Paresh H Paghadal
(74) *Attorney, Agent, or Firm* — Leydig, Voit & Mayer, Ltd.

(57) ABSTRACT

A device module (100) and method for connection to a textile fabric (50) with electrically conductive threads (51, 52) to provide a fabric layer assembly (150). The device module (100) comprises a flexible foil (10) and a thermoplastic layer (20) to enable a mechanical connection (M) between the flexible foil (10) and the textile fabric (50). The device module (100) has an outer circumference (C) comprising inward notches (N1,N2) configured as anchor points (Continued)

for respective conductive threads (51, 52) for holding and guiding the conductive threads (51,52) over and in contact with the respective conductive areas (11, 12) for providing the respective electrical connections (E1,E2) while the mechanical connection (M) by the thermoplastic layer (20) is established.

15 Claims, 8 Drawing Sheets

(51) Int. Cl.
  *H05K 1/18* (2006.01)
  *H05K 3/36* (2006.01)
(52) U.S. Cl.
  CPC ........... *H05K 2201/0129* (2013.01); *H05K 2201/029* (2013.01); *H05K 2201/0281* (2013.01); *H05K 2201/09145* (2013.01); *H05K 2201/10106* (2013.01); *H05K 2201/10151* (2013.01); *H05K 2201/10598* (2013.01)
(58) Field of Classification Search
  CPC ... H05K 2201/029; H05K 2201/09145; H05K 2201/10146; H05K 2201/10151; H05K 2201/10598; H01R 12/77; A41D 1/0002; A41D 1/0005; A41D 13/0007; A41D 13/0051; A41D 13/0058; A41D 27/085
  See application file for complete search history.

(56) References Cited

U.S. PATENT DOCUMENTS

| | | | |
|---|---|---|---|
| 7,022,917 B2 | 4/2006 | Jung et al. | |
| 8,783,903 B2 | 7/2014 | Bhattacharya et al. | |
| 9,179,586 B2* | 11/2015 | Brun | H01L 23/4985 |
| 2001/0052424 A1* | 12/2001 | Kume | H05K 3/3405 |
| | | | 174/262 |
| 2009/0200066 A1* | 8/2009 | Vicard | G06K 19/027 |
| | | | 174/255 |
| 2010/0149767 A1 | 6/2010 | Biesheuvel et al. | |
| 2011/0226515 A1* | 9/2011 | Son | H01L 23/49827 |
| | | | 174/259 |
| 2012/0118427 A1* | 5/2012 | Brookstein | D03D 1/0088 |
| | | | 139/35 |
| 2012/0327651 A1 | 12/2012 | Cornelssen et al. | |
| 2013/0027963 A1* | 1/2013 | Van Herpen | G09F 9/33 |
| | | | 362/551 |
| 2013/0201636 A1* | 8/2013 | Van Den Brand | |
| | | | H01L 27/3293 |
| | | | 361/749 |
| 2015/0041201 A1* | 2/2015 | Van Heck | H05K 1/09 |
| | | | 174/260 |

FOREIGN PATENT DOCUMENTS

| | | | | |
|---|---|---|---|---|
| WO | WO 2009/037631 A1 | 3/2009 | | |
| WO | WO-2010058360 A1 * | 5/2010 | ............... | G09F 9/33 |
| WO | WO 2014/207102 A1 | 12/2014 | | |

* cited by examiner

FLEXIBLE DEVICE MODULE FOR FABRIC LAYER ASSEMBLY AND METHOD FOR PRODUCTION

CROSS-REFERENCE TO RELATED APPLICATIONS

This patent application is a U.S. National Phase of PCT International Application No. PCT/NL2016/050059, filed Jan. 26, 2016, which claims priority to European Application No. 15152661.3, filed Jan. 27, 2015, which are both expressly incorporated by reference in their entireties, including any references contained therein.

TECHNICAL FIELD AND BACKGROUND

The present disclosure relates to a flexible device module for connection to a textile fabric with electrically conductive threads and a method for providing the connection. The disclosure further relates to a fabric layer assembly comprising the flexible device module and a garment comprising the fabric layer assembly.

Integration of electrical devices or circuitry with textile fabric can add new functionality. For example clothing can be equipped with integrated light emitting devices (LEDs), which can make the wearer more visible at night. Also other devices and functionality can be provided, e.g. sensors, computing, antennae, etceteras. To provide power or signals to and from the device modules an electrically conductive thread or yarn can be introduced onto or into the textile e.g. by lamination, weaving, knitting, embroidery (soutage or stitching), etceteras. Also printed structures on supports like rubber may act as conductive threads.

For example, U.S. Pat. No. 7,022,917 describes a method for electrically connecting an electrical conductor to an electronic component including the steps of providing a textile material in which at least one thread-like electrical conductor is arranged, providing the electrical conductor relative to an electrically conductive contact point of the electronic component, and electrically connecting the conductor to the contact point comprising the steps of electrically connecting an at least partly electrically conductive auxiliary contact to the conductor, and electrically connecting the auxiliary contact to the contact point, wherein the auxiliary contact is a metal lamina.

There remains a desire for further improvement to provide flexibility in placement of the device module on the textile while ensuring electrical contact with the conductive threads.

SUMMARY

A first aspect of the present disclosure provides a flexible device module for connection to a textile fabric with electrically conductive threads. The device module comprises a flexible foil comprising a first conductive area separated from a second conductive area by a non-conductive area therein between. The conductive areas form electrodes of an electrical circuit therein between, wherein the conductive areas are configured to enable respective electrical connections with the conductive threads. The device module comprises a thermoplastic layer at least partially covering the flexible foil and configured to enable a mechanical connection between the flexible foil and the textile fabric. The device module has a substantially flat shape with an outer circumference comprising inward notches configured as fixation or anchor points for respective conductive threads. The anchor point are configured for holding and guiding the conductive threads over and in contact with the respective conductive areas. In this way the respective electrical connections can be provided while the mechanical connection by the thermoplastic layer is established.

By providing anchor points for the conductive threads on the circumference of the device module, parts of the conductive threads can be held in place over the respective areas of the electrodes. The device module can be easily repositioned while keeping the conductive threads in contact with the electrodes. A mechanical connection can be provided e.g. by hot pressing the module and fabric layer together while the conductive threads remain in place therein between to form the respective electrical connections with the conductive areas.

By providing the conductive areas on a path between the notch and another guidance point on the circumference, the thread can be pulled tight over the path to ensure contact with the electrode, e.g. at an underside of the module that is otherwise not visible. By providing the paths such that they do not cross each other's conductive areas, it can be prevented that the threads come into contact with the wrong electrode. For example, the other guidance point can be provided by a further structure of the circumference, e.g. another notch or cut to receive the thread, and/or another visual indicator to provide a second guidance point to align the thread below the module. By providing two guidance points or structures on the circumference, the thread can be pulled therein between over the designated conductive area. By using two anchor points the thread can be held therein between over the conductive area while the device module can be more easily repositioned.

A notch in the circumference of the device module is shaped e.g. as an inward or concave cut, indentation or incision, typically having an opening diameter or width corresponding to that of the thread to allow introduction of the thread from the outside into the notch. For example a conductive thread may have a thread diameter between 0.5 to 5 millimeter, e.g. 1 millimeter. A corresponding a notch diameter or width (e.g. transverse to a path of the notch into the circumference) can be the same as the wire diameter, e.g. within a margin (plus or minus) of 50 percent, e.g. 0.5±0.25 millimeter. Also other margins are possible, which may e.g. depend on a flexibility or elasticity of the material around the edge of the notch. If the notch width is smaller than the thread, it can facilitate fixation of the thread. If the notch width is wider than the thread, it can be easier to insert the thread. The notch diameter can also vary along a path length of the notch, e.g. wider at the edge for easy insertion, than narrower along the path inwards to anchor the thread. In another or further example a notch diameter or width can be in a range between 0.1 to 10 millimeter, preferably between 0.3 and 5 millimeter, more preferably between 0.5 and 3 millimeter.

By providing an radially extended notch or cut, the thread can be at least partially enclosed inside the notch. By providing a notch as an elongate path into the outer circumference, e.g. more deep than wide, the conductive thread can be brought from outside the circumference along the path into the notch, e.g. to be held at or near an end of the path. By providing the notch wherein a diameter of the elongate path is narrowing along the path into the notch the conductive thread can be clamped by the notch along the path. By providing a notch having a more narrow width or diameter at the edge, the thread can be prevented from exiting the notch. By providing the notch with a curved or bended path, it can also be more difficult for the thread to exit the notch e.g. in a straight direction. By providing the notch with a jagged edge, the conductive thread can be gripped in between the edges for further fixation.

By providing the device module with a certain degree of flexibility, the module may bend and/or flex together with the textile fabric layer onto which it is to be bonded. This can improve user experience when the device is worn as part of a clothing article. In this regard, the module may be regarded as flexible if it can be bent e.g. over a radius of ten centimeters or less without losing essential electric functionality. In some cases more flexibility is desired corresponding to smaller bending radii, e.g. five, two, or even one centimeters, or even less e.g. between 1 and 5 millimeters. In some cases less flexibility is acceptable, e.g. with bending radii of twenty, fifty or even hundred centimeters. The smaller the bending radius, the more comfortable (less noticeable) the device module for a wearer. While the device module as a whole is preferably flexible, the module may comprise discrete components that are not flexible or less flexible, e.g. an LED component. Such components can e.g. be locally reinforced by a thicker layer to prevent breakage or failure of the electrical and mechanical interconnection when the module is bent. Accordingly, the local bending radius at the device location can be made higher than that of the module as a whole.

For example the flexible foil comprises a polymer foil with a patterned layer of silver paste forming the conductive areas. Also other types of foil (e.g. metal) and conductive materials (e.g. copper) can be used. The foil and any components thereon can be fully or partially encapsulated between thermoplastic layer for protection. For example thermoplastic polyurethane (TPU) can be used to both protect the electrical components as well as provide a bonding with a textile material. For example by hot pressing the module with TPU onto a fabric, a durable mechanical connection can be established by penetration of the TPU into the textile therefore interlocking is achieved. Also other suitable thermoplastic materials can be used.

Preferably, the device module is not only flexible, but also stretchable. This can further improve user experience, e.g. when the device is worn as part of a clothing article. In this regard, the module may be regarded as stretchable if the device module can be stretched along one or more dimensions without losing essential electrical functionality. For example, the device module can be elongated along a dimension by at least five percent (factor 1.05) without losing essential electrical functionality, preferably more, e.g. ten, twenty, fifty, or even hundred percent.

While the device module as a whole is preferably stretchable, the module may comprise discrete components or parts that are not stretchable or less stretchable, e.g. an LED component. Such components can e.g. be locally reinforced by a non-stretchable layer to prevent breakage or failure of the electrical and mechanical interconnection when the module is stretched. Accordingly, the local stretchability at the device location can be lower than that of the module as a whole. To improve stretchability of the device module, e.g. some non stretchable components or layers can be adapted. For example a non stretchable foil such as PEN can be cut into shape that allows some stretching along one or more dimensions. For example the foil can be cut in a meandering shape, or holes can be added in the foil to allow stretchability of the device module. Alternatively, or in addition, a stretchable foil is used. The foil may comprise stretchable conductive structures, e.g. meandering structures or comprising filaments.

Also the conductive threads are preferably stretchable to some degree, e.g. can be stretched at least five, ten, twenty, fifty, or even hundred percent without losing electrical functionality. By providing stretchable conductive threads, placement of the device module can be more versatile and/or the electrical connection more reliable. When the yarn is deformable from a round diameter to an oval shape upon interconnecting, an area of contact between yarn and electronics may be increased. To further improve reliability of the device module, the point of fixation on the flexible module can be decoupled mechanically from the remainder of the module by introducing a stretchable region on the electronic module. In this way, tension that is generated when the assembly of textile and module are stretched or bent can be distributed over a larger area relieving the fixation point from an excess of load.

A second aspect of the present disclosure provides a fabric layer assembly comprising the device module as described herein and a textile fabric with embedded electrically conductive threads. The device module is mechanically bonded to the textile fabric via the thermoplastic layer. The first conductive thread ends at or past the first notch while the first conductive thread is positioned over and in electrical contact with the first conductive area. Similarly, the second conductive thread ends at or past the second notch while the second conductive thread is positioned over and in electrical contact with the second conductive area.

Many different functionalities can be provided by the assembly of the device module with a fabric layer. Also multiple device modules can be provided on a fabric layer, e.g. interconnected to each other or to a common battery, e.g. power source or storage. Energy may also be created by or from the body of the wearer, or e.g. via solar cells that can be integrated in the same or other device modules in the fabric layer. The fabric layer with one or more modules may be comprised e.g. in a garment such as a coat, sweater, shirt, pants, sock, underwear, glove, hat, shoe, etceteras. Also technical textiles like bed linen or geo textiles can be equipped with electronic modules in the claimed method.

In one example, the electrical circuit of the device module comprises a light emitting device. By disposing the light emitting device e.g. at an opening through the fabric layer, the device can be configured to emit light there through. The light can be directed outward, e.g. to provide enhanced visibility of the wearer, or the light can be directed inward, e.g. for providing photo-therapy to the user. The device module can also be disposed between two or more fabric layers. In this way, the device can be hidden and/or shielded from both sides by fabric layers.

By providing the electrically conductive threads with an electrically insulating shell consisting of thermoplastic material, the shell can be locally melted during assembly to expose an electrically conducting core e.g. in contact with the electrodes while keeping the rest of the thread insulated. Also other ways can be envisaged for providing electrical connection with the threads at the electrodes while keeping other parts insulated. For example, parts of the wire can be covered by additional layers of thermoplastic material, that can be separate or part of the device module, e.g. a flap.

A third aspect of the present disclosure provides a method for connecting a flexible device module to a textile fabric with conductive threads. The method comprises providing the device module e.g. as described herein. The method comprises bringing a first conductive thread through the first notch and bringing a second conductive thread through the second notch. The method comprises positioning the device module onto the textile fabric with a middle part of the conductive threads therein between while pulling respective ends of the conductive threads tight against the notches thereby guiding the conductive threads over and in contact with the respective conductive areas. The method comprises applying pressure and/or heat to the device module and textile fabric to establish mechanical bonding between the device module and the textile fabric via the thermoplastic layer while enabling respective electrical contacts between the conductive threads and the conductive areas. For example a hot press can be used to bond the device module with the textile fabric.

In principle two points are desired to positively establish the position of the thread on the device module, in particular to ensure that the thread crosses the respective conductive areas. The notch on the device module provides at least one of the anchor points to position one end of the thread. Another anchor point can also be provided on the device module, e.g. by another notch or visual or tactile indicator on the edge of the module. Alternatively, or additionally, a anchor point can be provided by the connection of the thread to the fabric layer, e.g. the point where the thread exits the fabric layer. The thread can be pulled between the exit point of the fabric and the notch on the module. The module can be rotated to pull the wire over a second guidance point on the module edge to ensure that the wire crosses the conductive area therein between. While holding an end of the thread tight, a hot press can be applied to fixate the module to the fabric layer with thread contacting the electrode.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
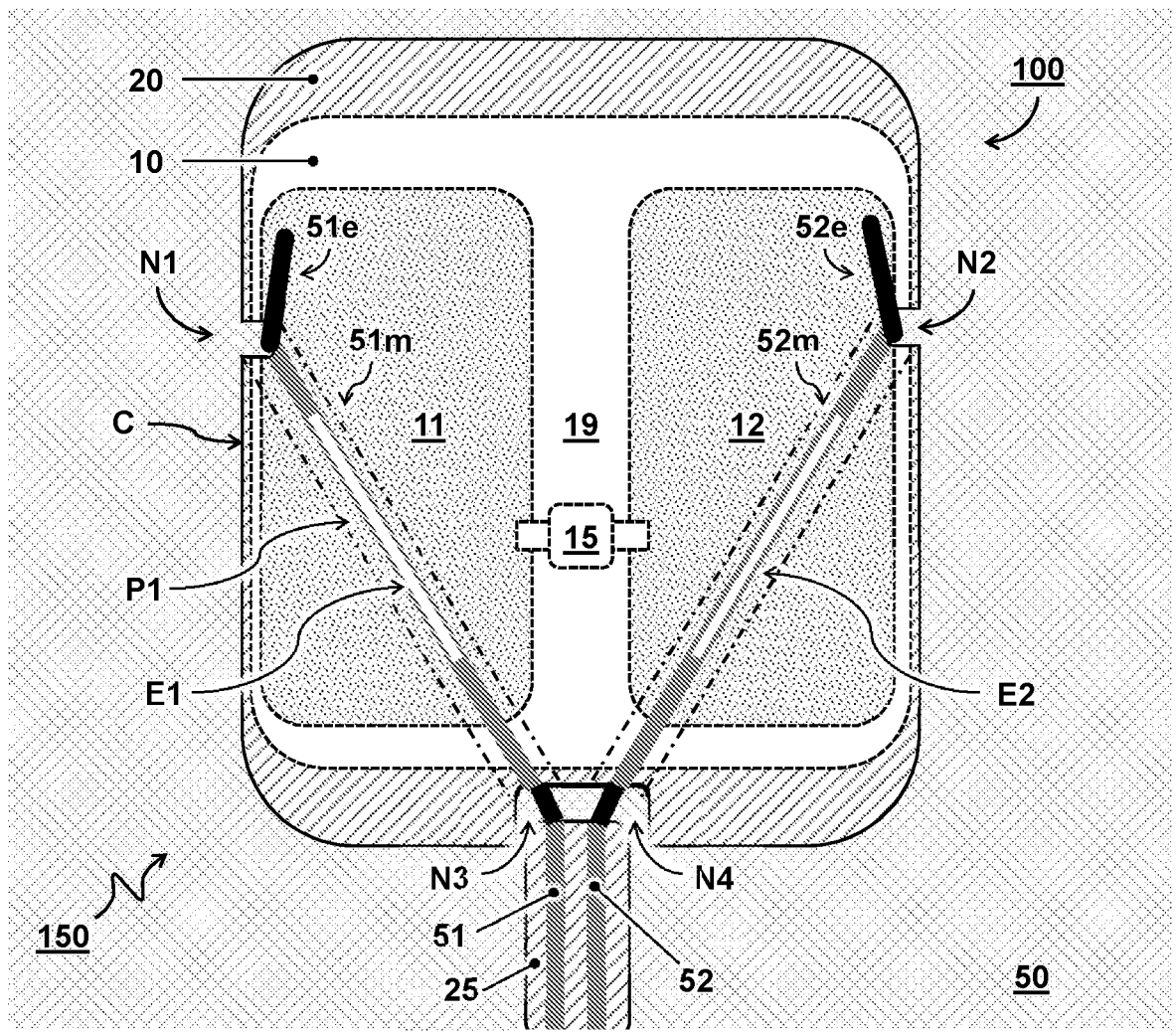
FIG. 1A shows a top view of an embodiment of a device module for connection to a textile fabric with electrically conductive threads.

Unless otherwise defined, all terms (including technical and scientific terms) used herein have the same meaning as commonly understood by one of ordinary skill in the art to which this invention belongs as read in the context of the description and drawings. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise. All publications, patent applications, patents, and other references mentioned herein are incorporated by reference in their entirety. In case of conflict, the present specification, including definitions, will control.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise. For example, where it is stated that a conductive wire is positioned over a conductive area, this can also mean that the conductive wire is under the conductive area, depending on perspective and orientation.

Figure 1B:
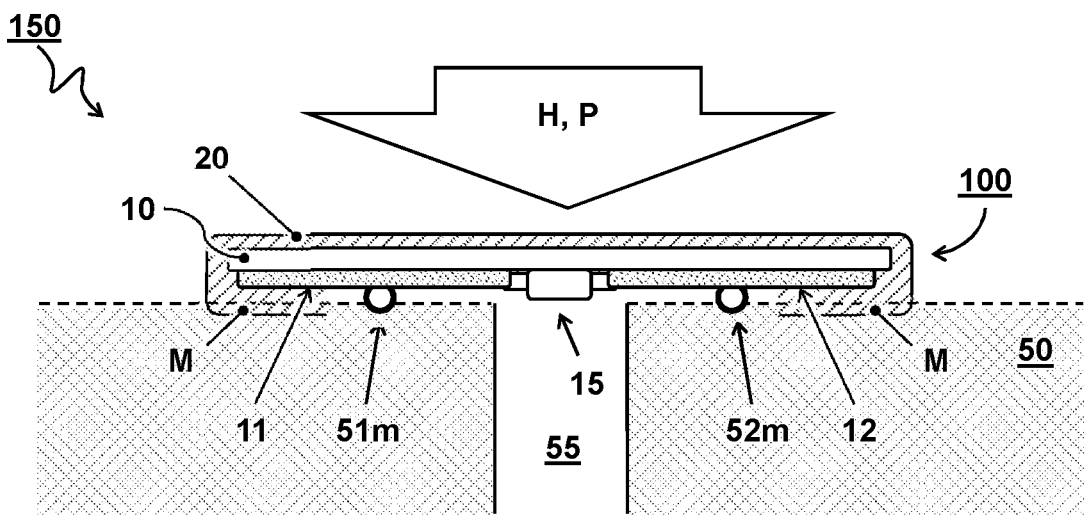
FIG. 1B shows a corresponding cross-section view.

FIG. 1A shows a top view of an embodiment of a device module 100 for connection to a textile fabric 50 with electrically conductive threads 51,52. FIG. 1B shows a corresponding cross-section view.

In the embodiment, the device module 100 comprises a flexible foil 10. The flexible foil 10 comprises a first conductive area 11 separated from a second conductive area 12 by a non-conductive area 19 therein between. The conductive areas 11,12 form electrodes of an electrical circuit therein between. The conductive areas 11,12 are configured to enable respective electrical connections E1,E2 with the conductive threads 51,52.

In the embodiment, the device module 100 comprises a thermoplastic layer 20 at least partially covering the flexible foil 10 and configured to enable a mechanical connection M between the flexible foil 10 and the textile fabric 50. The phrases textile, cloth, and/or fabric as used herein may generally refer to a flexible woven material consisting of a network of natural or artificial fibres often referred to as thread or yarn. For example the textile fabric is used for a garment, medical bandage, linen article, geo textile, etceteras.

In the embodiment, the device module 100 has a generally flat shape with an outer circumference C (as seen from the top view). The circumference C comprising inward notches N1,N2 configured as anchor points for respective conductive threads 51,52. The notches N1,N2 provide functionality for holding and guiding the conductive threads 51,52 over and in contact with the respective conductive areas 11,12. In this way the respective electrical connections E1,E2 can be provided and/or maintained while the mechanical connection M by the thermoplastic layer 20 is established.

For example pressure P and/or heat H can be applied to the device module 100 and textile fabric 50 to establish mechanical bonding M between the device module 100 and the textile fabric 50 via the thermoplastic layer 20 while enabling respective electrical contacts E1,E2 between the conductive threads 51,52 and the conductive areas 11,12. For example, mechanical connection M can e.g. be provided by the thermoplastic layer 20 partially melting and solidifying interlocking into the structure of the textile fabric 50.

In one embodiment, the first conductive area 11 is disposed on the flexible foil 10 covering at least part of a first straight path P1 for the first conductive thread 51 between the first notch N1 and a first guidance point N3 at the outer circumference C distant from the first notch N1. Preferably, the first straight path P1 does not cross the second conductive area 12. Similarly, in another or further embodiment, the second conductive area 12 is disposed on the flexible foil 10 covering at least part of a second straight path P2 for the second conductive thread 52 between the second notch N2 and a second guidance point N4 at the outer circumference C distant from the second notch N1. Again, preferably the second straight path P2 does not cross the first conductive area 11.

In one embodiment, the first guidance point N3 is provided by a first guidance structure cut into the circumference C and configured to receive the first conductive thread 51. The guidance structure and the first notch N1 are relatively positioned at different parts of the outer circumference C to guide the first conductive thread 51 on the first straight path P1 therein between over and in contact with the first conductive area 11. A similar arrangement can be provided for the second thread. In one embodiment, the outer circumference including the notches is symmetric. This can provide easy alignment with respect to two wires. Alternatively, also an asymmetric or any other shape can be used.

In one embodiment, the flexible foil 10 comprises a polymer foil, e.g. PET, PEN, PI. Alternatively, the flexible foil 10 comprises a metal foil. Also other types of flexible material may be envisaged for the foil 10. The flexible foil 10 preferably has a flexibility that is sufficient to allow bending such that it can follow the movement of the fabric layer in use. For example, flexible foil can be bent over a radius of ten centimeters or less without breaking. For example, a flexible foil can have a thickness between 10 and 1000 micrometers, preferably between 20 and 500 micrometers, e.g. 50 micrometers. The thinner the foil, the less obtrusive the module can be for a user, however, it may also break more easily. Also other thicknesses of the foil and module are possible. The foil 10 can be locally or completely reinforced by other layers, e.g. by the thermoplastic layer 20.

In one embodiment, the flexible foil 10 comprises a patterned layer of silver paste or other conductive material (e.g. copper) forming the conductive areas 11,12. Also other conductive, semi-conductive, and non-conductive layers can be applied to the foil to build a circuit thereon. In one embodiment, all circuit parts are on one side of the foil, preferably facing the textile fabric 50 for protection. In another embodiment, electronic parts may be on both sides or on the side facing away from the fabric. For example, electrodes can be on one side and a electro-physical transducer on the other side. The foil can e.g. be transparent and a light emitting device can emit through the foil. In the embodiment shown, the device module 100 has a fabric layer only on one side. In another embodiment (not shown), the device module 100 is disposed between two fabric layers. Alternatively or in addition further layers can be applied on one or both sides, e.g. fabric or other material.

In one embodiment, the flexible foil 10 comprises an electro-physical transducer 15 forming part of the electrical circuit. An electro-physical transducer as described herein, is a component or device that converts an electrical signal into a physical phenomenon, or that converts a physical phenomenon into an electrical signal. Examples of the first are electro-luminescent devices, electro-acoustic devices, and electro-chrome devices. Examples of the second are photovoltaic devices, acoustic sensors, and touch sensors. Of course the electrical circuit may comprise multiple components which may or may not be electro-physical transducers. For example the circuit may additionally or alternatively comprise any combination of resistors, capacitors, transistors, antennae, sensors, LEDs, integrated circuitry, chips, etceteras.

In one embodiment, the thermoplastic layer 20 comprises thermoplastic polyurethane TPU. Also other thermoplastic materials can be used. A thermoplastic or thermo softening plastic, is a plastic material, typically a polymer, that becomes pliable or moldable above a specific temperature and solidifies upon cooling. When heat H and or pressure P is applied to the stack 150 with the thermoplastic material 20, it can form a mechanical bond M with the textile fabric 50, e.g. by partially penetrating into its woven structure. Preferably, at least some of the thermoplastic layer 20 on the device module 100 extends to the side of the module that in use faces the fabric to form a bonding therein between. Alternatively, or additionally, the edge of the thermoplastic layer 20 may extend beyond that of the flexible foil 10. In this way at least the edges can be sealed to the textile fabric 50. Alternatively, or additionally, the flexible foil 10 may comprise one or more holes through which a top layer of the thermoplastic layer 20 can pass to through to the textile fabric 50.

For example, hot pressing the stack comprising thermoplastic material may result in mechanically anchoring (interlocking) layers into textile while at the same time electrically connecting yarns or threads to the module. Furthermore the electronics may be sealed from external contact and isolated. Potentially simultaneously or consecutively addition layers (of textile or alike) may be applied to cover electronics and improve comfort to the wearer. Advantageously these and other features of the present disclosure may allow positioning of the device module at the last phase of manufacturing and achieve high material usage efficiency and freedom of design.

While a thermoplastic layer thus provides synergetic advantage to the present application e.g. with regards to the flexibility of module placement and anchoring of the threads, alternatively or additionally, also other adhesive layers can be used. Accordingly, in another embodiment (not shown), the device module and/or fabric layer assembly comprises an adhesive layer to enable a mechanical connection between the flexible foil and the textile fabric.

In one embodiment, conductive thread is introduced onto/into the textile or fabric layer 50 by lamination, weaving, knitting, embroidery (soutage or stitching), etceteras. In one embodiment, connection to the electronic module is provided by fixation of the conductive thread in parts of the module that serve to hold the yarn and press and heat with resulting electrical connection. Isolation of the conductive thread can be removed e.g. at a position of connection prior to hot pressing or is during hot pressing released from its isolation as pressure distribution in the stack is resulting in preferential removal at the position of interconnection. For example, in case dimensions and thickness of the thread results in such topology that without any pressure distribution pads in the hot press the pressure on yarn plus module is substantially higher than in regions in which the yarn is not present. In one embodiment, the electrically conductive threads 51,52 comprise an electrically conductive core covered by an electrically insulating shell consisting of thermoplastic material.

The FIGS. 1A and 1B further illustrate an embodiment of a fabric layer assembly 150 comprising the device module 100 and a textile fabric 50 with embedded electrically conductive threads 51,52. The device module 100 is mechanically bonded (M) to the textile fabric 50 via the thermoplastic layer 20. The first conductive thread 51 ends at the first notch N1. The first conductive thread 51 is positioned over and in electrical contact (E1,E2) with the first conductive area 11. The second conductive thread 52 ends at the second notch N2. The second conductive thread 52 is positioned over and in electrical contact with the second conductive area 12.

In one embodiment, as shown in FIG. 1B, the electrical circuit comprises a light emitting device 15 disposed at an opening 55 through the textile fabric 50 layer for emitting light through the opening 55. It will be appreciated that the present module is particularly suitable for positioning the module 100 with the light emitting device 15 in line with the opening 55 while keeping the conductive threads 51, 52 in electrical contact with the conductive areas 11,12 and fixating the module 100 to the fabric 50.

In one embodiment (not shown), one or more fabric layer assemblies are part of a garment. In one embodiment (not shown), the garment comprises a battery electrically connected to the device module via the conductive threads. The device modules can also be connected to each other, e.g. to exchange data or electrical power. In one embodiment, a first device module comprises a power generator, e.g. by solar energy or body energy. In a further embodiment, a second device module is electrically connected to the first module to draw power there from.

The FIGS. 1A and 1B further illustrate an embodiment a method for connecting a flexible device module 100 to a textile fabric 50 with conductive threads 51,52. In one embodiment, the method comprises providing the device module 100, e.g. as described herein or otherwise. In the method, a first conductive thread 51 is through the first notch N1 and a second conductive thread 51 is brought through the second notch N2. In a further step the device module 100 is positioned onto the textile fabric 50 with a middle part 51m,52m of the conductive threads 51,52 therein between while pulling U respective ends 51e,52e of the conductive threads 51,52 tight against the notches N1,N2 thereby guiding the conductive threads 51,52 over and in contact with the respective conductive areas 11,12. Pressure P and/or heat H can be applied to the device module 100 and textile fabric 50 to establish mechanical bonding M between the device module 100 and the textile fabric 50 via the thermoplastic layer 20 while enabling respective electrical contacts E1,E2 between the conductive threads 51,52 and the conductive areas 11,12.

In one embodiment, a conductive thread 51 is pulled tight between the respective notch N1 in the circumference C of the device module 100 and a fixation provided by the conductive thread 51 being partially embedded in the textile fabric 50. In another or further embodiment, a conductive thread 51 is pulled tight between the respective notch N1 in the circumference C of the device module 100 and a further guidance structure N3 on the circumference C of the device module 100.

While the present embodiment shows only two conductive threads 51,52 and corresponding conductive areas 11,12, alternatively, also further threads and electrodes can be provided. For example, three or more conductive areas with corresponding notches can be provided, wherein the first two are used as anode/cathode and the third for data transmission/reception. It is also possible to provide multiple electrodes/threads that are connected in parallel, e.g. as redundant connection. An example of this is shown e.g. in FIG. 8.

Figure 2A:
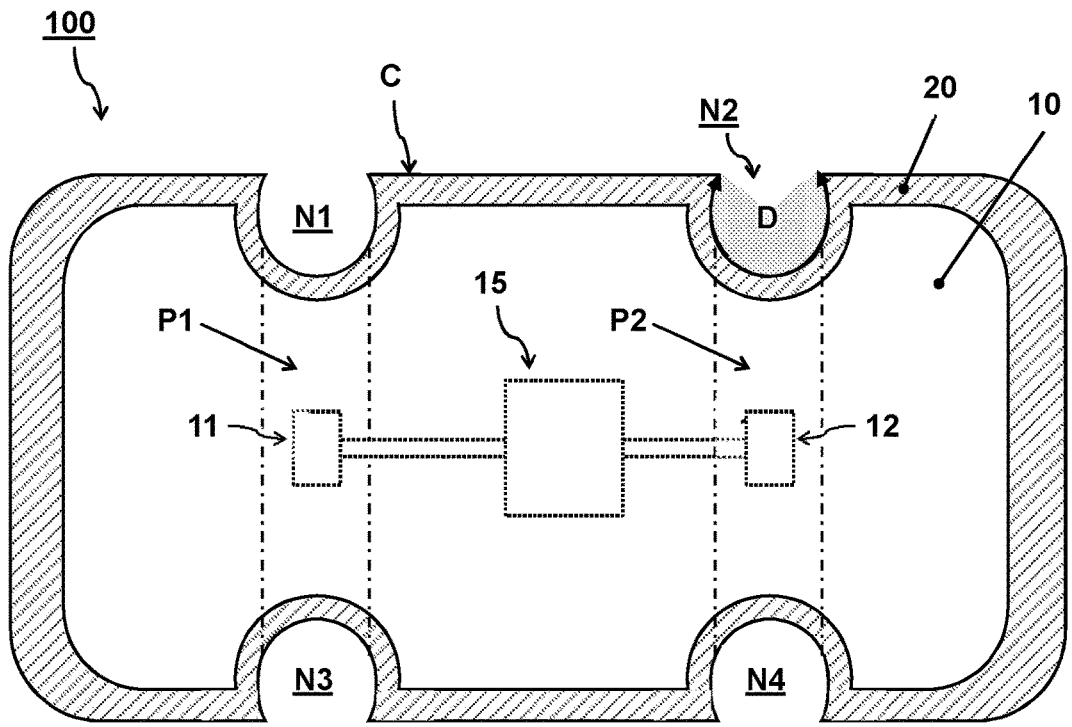
FIG. 2A shows a top view of another embodiment of a device module.
Figure 2B:
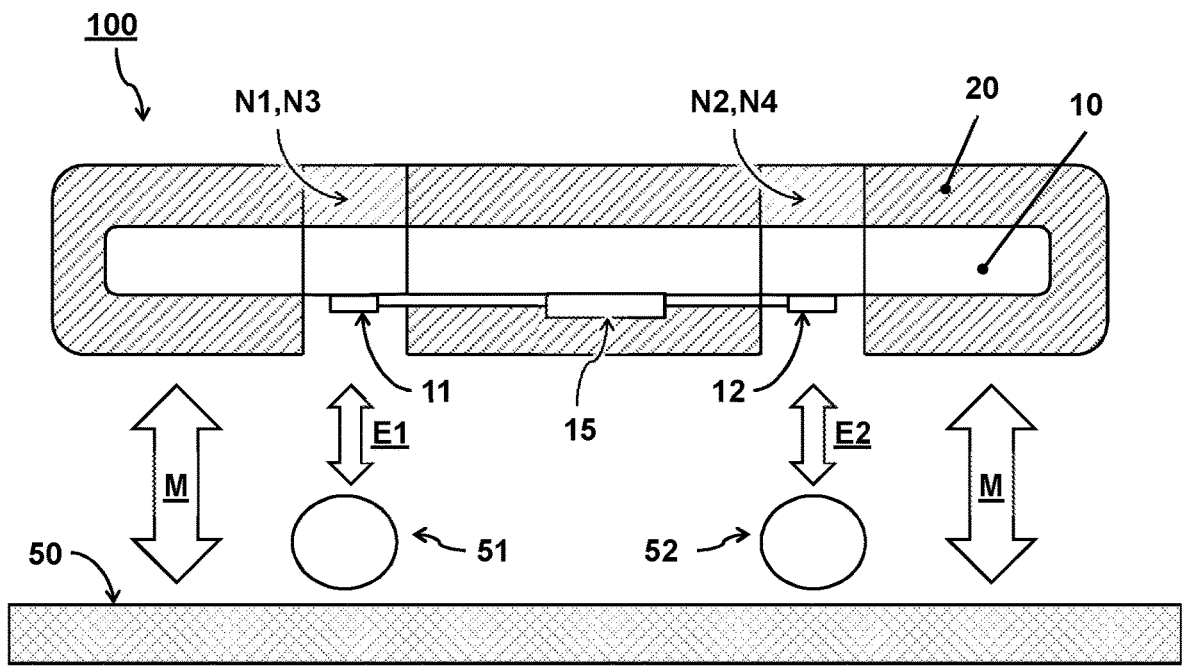
FIG. 2B shows a corresponding cross-section view including the textile fabric and conductive threads.

FIG. 2A shows a top view of another embodiment of a device module 100. FIG. 2B shows a corresponding cross-section view including the textile fabric 50 and conductive threads 51,52.

In the present embodiment, the conductive areas 11,12 are smaller than in FIG. 1A. Nevertheless, the conductive areas 11,12 cover at least part of the respective paths P1,P2 between the respective notches N1,N2 and their guidance points N3,N4.

In the embodiment, two pairs of notches N1,N3 and N2,N4 are provided with the respective conductive areas 11,12 on the paths P1 and P2 therein between. The notches N3 and N4 forming the guidance structure or second point on the edge for each thread, are configured to at least partially fixate and/or guide the conductive threads by an edge diameter of the said notches similar as the notches N1,N2.

In one embodiment, the guidance point N3 comprises a visual indicator for positioning the conductive thread 51 on an edge of the circumference C relative to the first notch N1 for guiding the first conductive thread 51 over the first conductive area 11 therein between. visual indicator can be provide e.g. by the cut N3 into the foil and/or by a drawing on the foil at the position of N3.

In one embodiment, at least one of the notches (illustrated for N2) comprises a notch diameter D extending over at least 180 degrees for partially enclosing the respective conductive thread 51,52 inside the notch diameter Generally, the notches are formed in the circumference C of the device module 100. In the present embodiment, the notches are formed in the circumference C of the thermoplastic layer 20 having an edge which extends beyond that of the flexible foil 10. Alternatively, the thermoplastic layer 20 may not be present at the position of the notches, in which case the notches can be formed e.g. in the flexible foil 10. Also edge materials or combinations are possible.

FIGS. 3A-3D show various embodiments of a notch N1 in a circumference "C" of a device module 100. These figures illustrate that the fixation can further be optimised by shape definition of the hole/incision/cavity to capture the thread or yarn mechanically and restrict the possibility to leave the fixation point or notch.

Figure 3A:
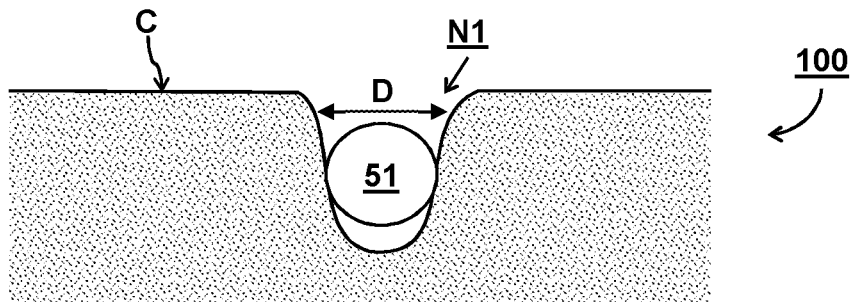
FIGS. 3A-3D show various embodiments of a notch in a circumference of a device module.
Figure 3B:
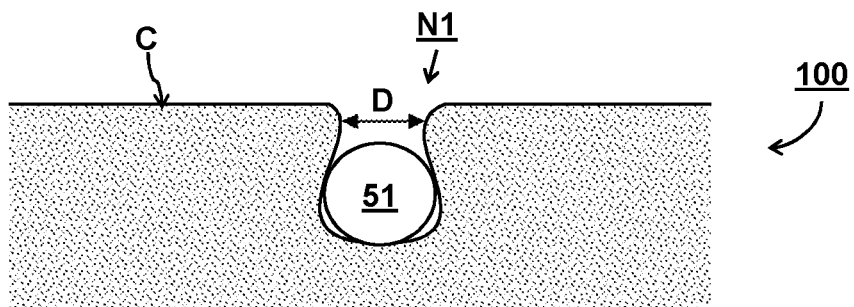
Figure 3C:
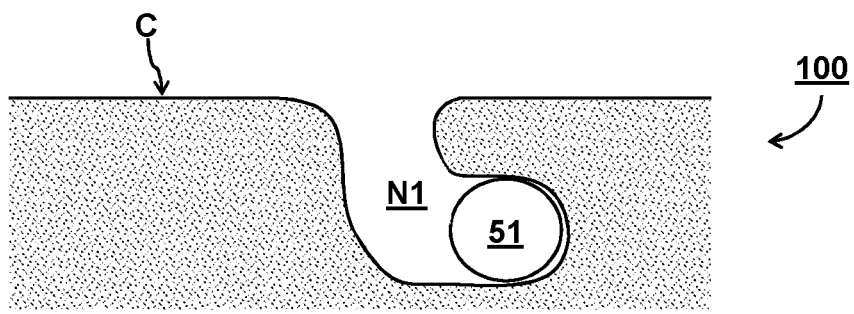
Figure 3D:
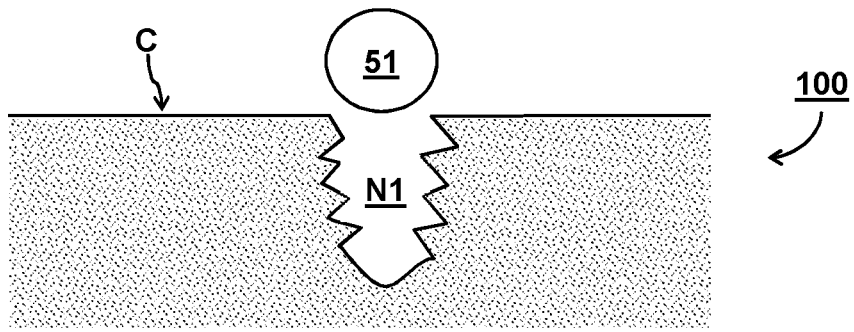

In one embodiment, at least one of the notches N1 comprises an elongate path cut into the outer circumference C for bringing the respective conductive thread 51 from outside the circumference C along the elongate path into the notch N1 to be held at an end of the elongate path inside the notch N1. In one embodiment, e.g. as shown in FIG. 3A, a diameter D of the path is narrowing along the path into the notch N1 for clamping the conductive thread 51 along the path. In one embodiment, as shown in FIG. 3B, a diameter D of the path is narrower at an edge of the notch at the outer circumference C than at an end of the notch N1 for bringing the conductive thread 51 past the narrowed edge into the end of the notch and preventing the conductive thread 51 from exiting the notch. In one embodiment, e.g. as shown in FIG. 3C, the elongate path is bended for preventing the conductive thread 51 from exiting the notch N1 in a straight direction. In one embodiment, e.g. as shown in FIG. 3D, the notch N1 comprises a jagged edge for gripping the conductive thread 51. Also combinations of these and other notch features can be applied to provide synergetic benefit for anchoring the conductive thread 51.

Figure 4A:
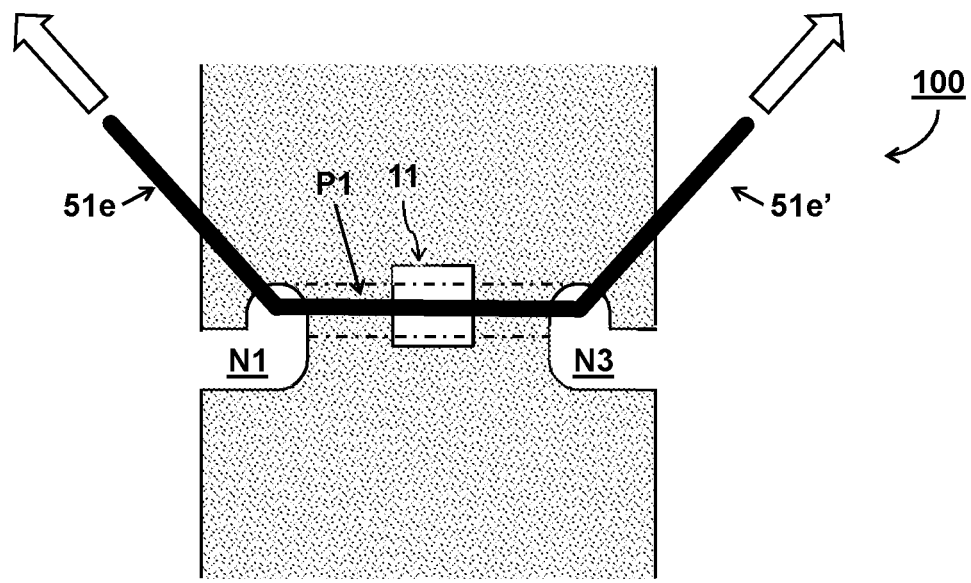
FIGS. 4A and 4B illustrate embodiments of relative notch configurations.
Figure 4B:
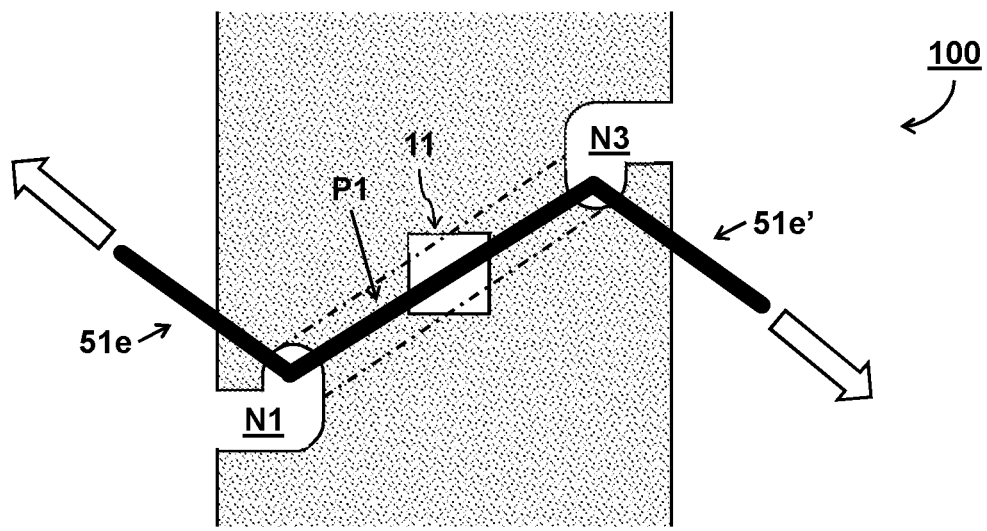

FIGS. 4A and 4B illustrate embodiments of a relative notch configurations N1,N3. In one embodiment as shown in FIG. 4A, the notches N1,N3 have a path ending in the same direction. In this case force (illustrated by the white arrows) can be applied in the same general direction on both ends 51e,51e' of the conductive thread to anchor the thread in the notches. In another embodiment as shown in FIG. 4B, the notches N1,N3 have a path ending in the opposite direction. In this case force can be applied on both ends 51e,51e' in opposite directions of the conductive thread to anchor the thread in the notches. By pulling the thread into the notches, the thread is pulled tight on a straight path P1 between the notches and passes over a conductive area 11 to make electrical contact. In one embodiment, the force e.g. on the thread part 51e' is provided by the thread being anchored to the fabric while the other end is free and can be pulled.

In one embodiment, the conductive thread is introduced in a first position in such a way that the direction the thread needs to be moved to exit the notch is opposite to the direction the yarn is given from the textile fixation point to the first module fixation point. In another or further embodiment, the thread position is secured relative to the electronic module by a second fixation point where the direction the yarn needs to be moved to exit the fixation point is opposite to the direction the yarn is given from the first module fixation point to the second module fixation point.

Figure 5:
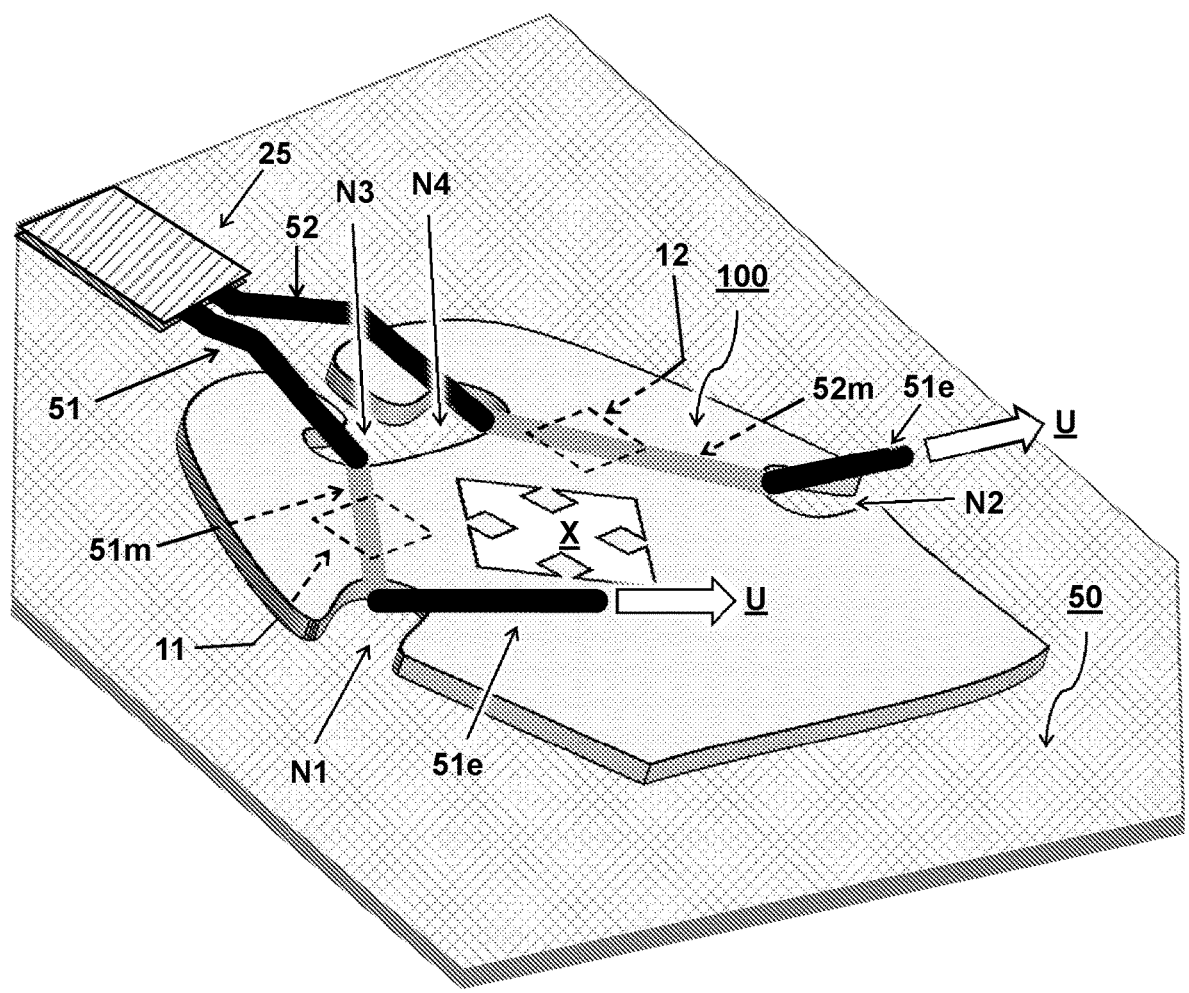
FIG. 5 shows a perspective view of another embodiment of a device module being positioned on a textile fabric.

FIG. 5 shows a perspective view of another embodiment of a device module 100 being positioned on a textile fabric 50. In the embodiment, a textile fabric 50 is provided with two conductive threads 51,52 partially laminated to the fabric e.g. by thermoplastic material 25. The device module 100 can be applied e.g. in the general vicinity of the exit point of the conductive threads from the textile fabric 50. A first conductive thread 51 is brought through the first notch N1 and a second conductive thread 51 through the second notch N2. The device module 100 is then positioned (X) onto the textile fabric 50 with a middle part 51m,52m of the conductive threads 51,52 therein between while pulling (U) respective ends 51e,52e of the conductive threads 51,52 tight against the notches N1,N2 thereby guiding the conductive threads 51,52 over and in contact with the respective conductive areas 11,12. When a satisfactory position has been found, pressure and/or heat can be applied to the device module 100 and textile fabric 50 to establish mechanical bonding.

In one embodiment, as shown, threads 51,52 exit the fabric at a common or nearby origin which may act as an anchor point. The threads can be pulled apart into the two respective notches N1,N2 while the device module 100 is rotated to have wires enter the guiding structure N3. When the threads 51,52 are pulled tight between the notches N1,N2 and the anchor point of the threads exiting the textile fabric 50, the thread may be in the correct position over the conductive areas 11,12.

Figure 6A:
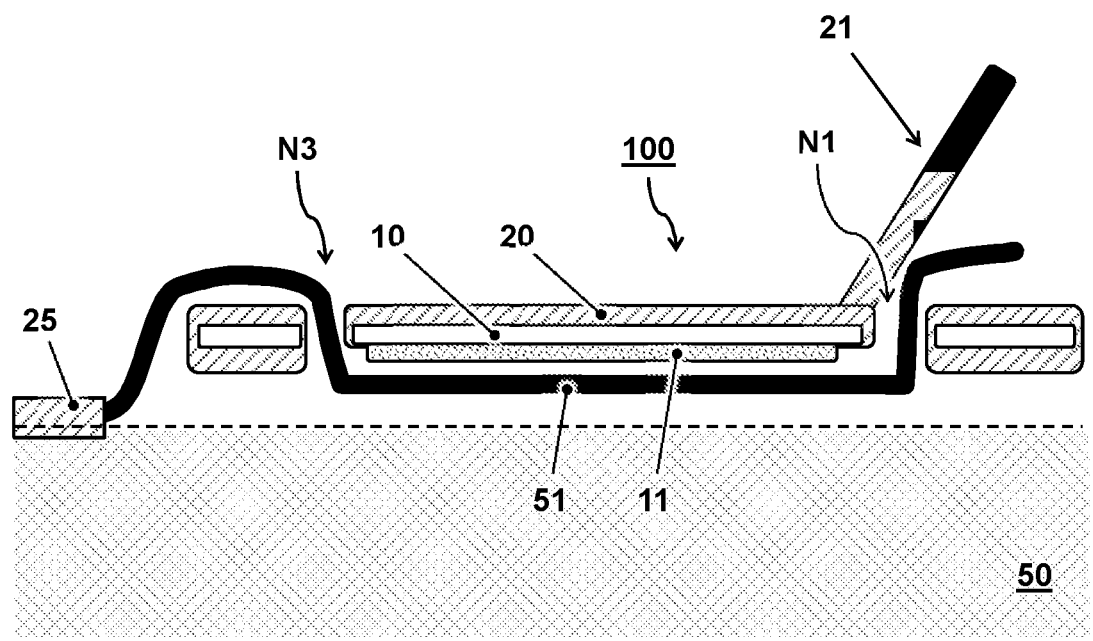
FIGS. 6A and 6B show cross-section views of steps in applying a device module to a textile fabric.
Figure 6B:
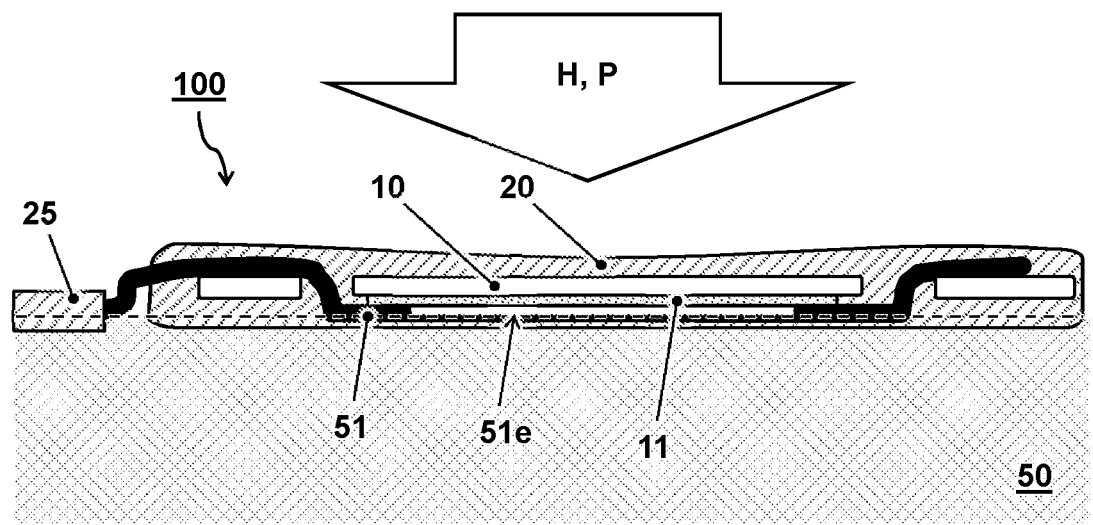

FIGS. 6A and 6B show cross-section views of steps in applying a device module 100 to a textile fabric 50. In FIG. 6A, the conductive thread 51 is passed into notch N3, below the device module 100, and out of notch N1. When the conductive thread 51 is pulled tight, the conductive thread 51 is positioned against the conductive area 11. In FIG. 6B, the device module 100 is pressed against the textile fabric 50 while applying pressure P and/or heat H (e.g. by a hot press). As a result, the device module 100 is bonded to the textile fabric 50 via the thermoplastic layer 20. In one embodiment, the application of heat and/or pressure results in the conductive thread 51 becoming partially exposed with an area 51e of the conductive thread contacting the conductive area 11. In another embodiment, a conductive part of the thread 51 is already exposed before. In one embodiment, a further layer of thermoplastic material 21 is applied and bonded over the ends of the conductive threads. In one embodiment, an exposed ending of the conductive thread 51 is covered by a layer of thermoplastic material, e.g. a flap 21 that is part of the module 100. Alternatively, a separate layer of thermoplastic material can be applied simultaneously, or in a subsequent process. In one embodiment, the conductive thread 51 exposed before hand only at a position where the contact with the first conductive area 11 is to be made while the ending is isolated by non-conducting material. In one embodiment, the insulating material of the conductive thread is removed by hard contact. In one embodiment, electrical contact is further improved by use of conducting adhesive like ICA or PSA.

Figure 7:
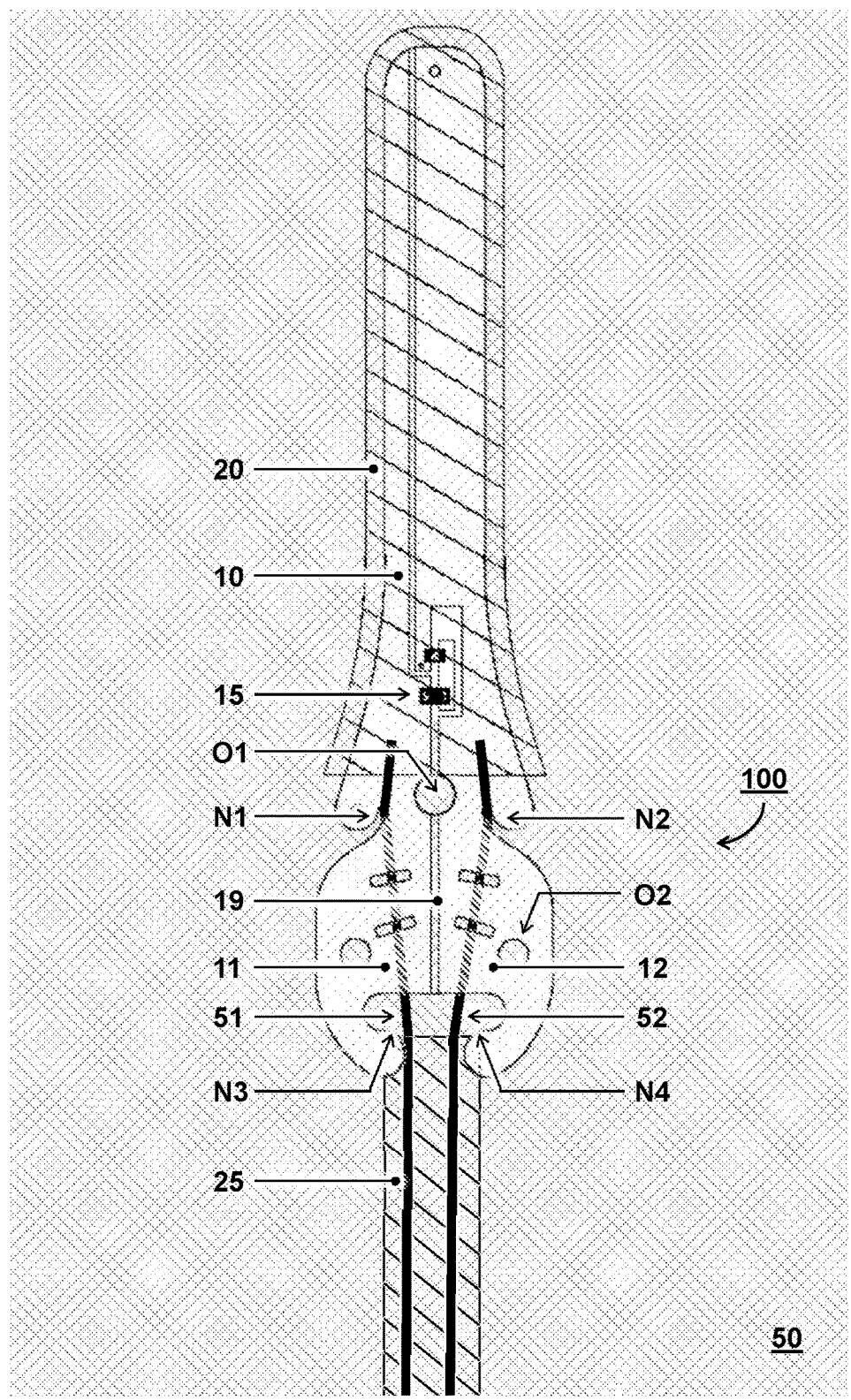
FIG. 7 shows a top view of another embodiment of a device module making contact with conductive threads on a textile fabric.

For example EP2351166 describes a method for connecting two parts mechanically and electrically at the same time. In order to establish the connection, the conducting parts are pressed against each other in the area of the connection surfaces of said conducting parts and in the area surrounding said connection surfaces. An adhesive is used as the electrically insulating material. The adhesive is put into a sticky state during the connection, thereby forming an electrical contact between the electrical connection surfaces and in the area surrounding said electrical connection surfaces, after which the adhesive is brought into a permanently adhering state FIG. 7 shows a top view of another embodiment of a device module 100 making contact with conductive threads 51,52 on a textile fabric 50. The conductive threads 51,52 are laminated to the textile fabric 50 by a thermoplastic layer 25 and exit the textile fabric 50 at a point where the device module 100 is to be positioned. The device module 100 is laminated by the thermoplastic layer 20 to the fabric while the conductive threads 51,52 pass over the respective conductive areas 11,12. The present embodiment of the device module 100 comprises a long tail section that can provide additional bonding area and allows easy repositioning. In one embodiment, the flexible foil 10 comprises one or more holes O1,O2. These can facilitate bonding of the thermoplastic layer 20 there through. In one embodiment, as shown the conductive area 11 covers a section surrounding the corresponding notch N1. In this way, the thread 51 can make contact at least at the edge of the notch.

Figure 8:
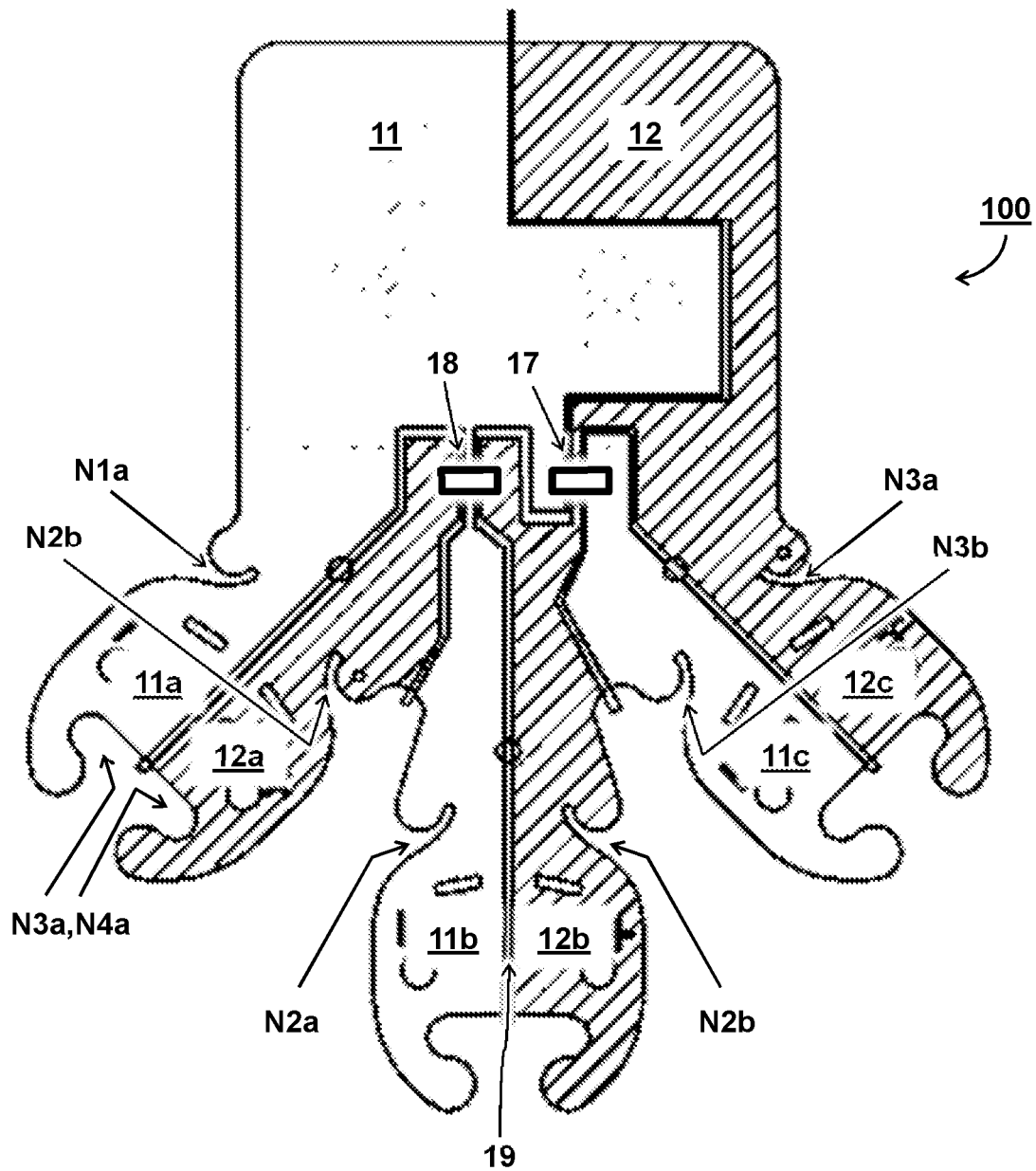
FIG. 8 shows a top view of another embodiment of a device module.

FIG. 8 shows a top view of another embodiment of a device module 100. In the present embodiment, the device module 100 has multiple sections for connection conductive threads. Each section has its own pair of notches N1,N2 and conductive areas 11,12 separated by non conductive area 19. In the present embodiment, each of the conductive areas 11a,11b,11c are electrically connected to each other e.g. by bridge 17 or otherwise. Similarly, each of the conductive areas 12a,12b,12c (indicated by hatching) are electrically connected to each other e.g. by bridge 18 or otherwise. For example, multiple conductive threads can be connected to provide redundancy.

For the purpose of clarity and a concise description, features are described herein as part of the same or separate embodiments, however, it will be appreciated that the scope of the invention may include embodiments having combinations of all or some of the features described. For example, while embodiments were shown for different shapes of modules with notches, also alternative ways may be envisaged by those skilled in the art having the benefit of the present disclosure for achieving a similar function and result. It is appreciated that this disclosure offers particular advantages to the textile industry, and in general can be applied for any application wherein electronic devices are bonded to other layers with conductive threads. For example, in a device module for connection to a foil substrate the thermoplastic layer at least partially covering the flexible foil may be configured to enable a mechanical connection between the flexible foil and the foil substrate. In one embodiment, the surface on which the flexible device module is placed (e.g. fabric or foil) is pre-treated, e.g. as described in WO2015/084164.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. A device module for connection to a textile fabric having electrically conductive threads, the device module comprising:
   a flexible foil comprising:
      a first conductive area;
      a second conductive area; and
      a non-conductive area,
      wherein the first conductive area is separated from the second conductive area by the non-conductive area therein between,
      wherein the first conductive area and the second conductive area together form a positive electrode and a negative electrode of an electrical circuit connected therein between, and
      wherein the first conductive area and the second conductive area are configured to enable respective electrical connections with the electrically conductive threads; and
   a thermoplastic layer at least partially covering an external surface of the flexible foil opposite an internal surface of the flexible foil, wherein the thermoplastic layer is configured to provide a mechanical connection between the internal surface of the flexible foil and the textile fabric,
   wherein the device module has a flat shape with an outer circumference comprising an inward notches configured as anchor points for respective ones of the electrically conductive threads for holding and guiding the ones of the electrically conductive threads over and in contact with respective ones of the first conductive area and the second conductive area for providing the respective electrical connections while the mechanical connection by the thermoplastic layer with the textile fabric is established.

2. The device module according to claim 1, wherein the first conductive area is disposed on the flexible foil covering at least part of a first straight path for the first conductive thread between a first notch of the inward notches and a first guidance point at the outer circumference distant from the first notch, and
   wherein the first straight path does not cross the second conductive area.

3. The device module according to claim 2, wherein the first guidance point is provided by a first guidance structure cutting into the outer circumference and configured to receive the first conductive thread;
   wherein the first guidance structure and the first notch are relatively positioned at different parts of the outer circumference to guide the first conductive thread on the first straight path therein between over and in contact with the first conductive area.

4. The device module according to claim 3, wherein the first guidance structure comprises a third notch of the inward notches configured to at least partially fixate and/or guide the first conductive thread by an edge diameter of the third notch.

5. The device module according to claim 1, wherein at least one of the first notch and a second notch of the inward notches comprises a notch diameter extending over at least 180 degrees for partially enclosing the respective conductive thread inside the notch diameter.

6. The device module according to claim 1, wherein at least one of the first notch and a second notch of the inward notches comprises an elongate path cut into the outer circumference for bringing the respective conductive thread from outside the circumference along the elongate path into the notch to be held at an end of the elongate path inside the notch.

7. The device module according to claim 1, wherein the flexible foil comprises an electro-physical transducer forming part of the electrical circuit.

8. The device module according to claim 1, wherein the flexible foil comprises a polymer foil with a patterned layer of silver paste forming the first conductive area and the second conductive area.

9. A fabric layer assembly comprising:
   a textile fabric with a first and a second embedded electrically conductive thread;
   a flexible foil comprising:
      a first conductive area;
      a second conductive area; and
      a non-conductive area,
      wherein the first conductive area is separated from the second conductive area by the non-conductive area therein between,
      wherein the first conductive area and the second conductive area together form a positive electrode and a negative electrode of an electrical circuit connected therein between, and
      wherein the first conductive area and the second conductive area are configured to enable respective electrical connections with the first and the second embedded electrically conductive thread of the textile fabric; and
   a thermoplastic layer at least partially covering an external surface of the flexible foil opposite an internal surface of the flexible foil, wherein the thermoplastic layer provides a mechanical connection between the internal surface of the flexible foil and the textile fabric, wherein the flexible foil has a flat shape with an outer circumference comprising an inward notches configured as anchor points for respective ones of the first and the second embedded electrically conductive thread for holding and guiding the respective ones of the first and the second embedded electrically conductive thread over and in contact with respective ones of the first conductive area and the second conductive area for providing the respective electrical connections while the mechanical connection by the thermoplastic layer with the textile fabric is established, wherein the first embedded electrically conductive thread ends at a first notch of the inward notches and wherein the first embedded electrically conductive thread is positioned over and in electrical contact with the first conductive area, and wherein the second embedded electrically conductive thread ends at a second notch of the inward notches, wherein the second embedded electrically conductive thread is positioned over and in electrical contact with the second conductive area.

10. The fabric layer assembly according to claim 9, wherein the electrical circuit comprises a light emitting device disposed at an opening through the textile fabric layer for emitting light through the opening.

11. The fabric layer assembly according to claim 9, wherein the first and the second electrically conductive threads each comprise an electrically conductive core covered by an electrically insulating shell made of thermoplastic material.

12. The fabric layer assembly according to claim 9, wherein the fabric layer assembly is comprised in a garment.

13. A method for connecting a flexible device module to a textile fabric with conductive threads, the method comprising providing a device module comprising:
    a flexible foil comprising:
        a first conductive area;
        a second conductive area; and
        a non-conductive area,
        wherein the first conductive area is separated from the second conductive area by the non-conductive area therein between,
        wherein the first conductive area and the second conductive area each form electrodes of an electrical circuit therein between, and
        wherein the first conductive area and the second conductive area are configured to enable respective electrical connections with the electrically conductive threads; and
    a thermoplastic layer at least partially covering the flexible foil, wherein the thermoplastic layer is configured to enable a mechanical connection between the flexible foil and the textile fabric,
    wherein the device module has a flat shape with an outer circumference comprising inward notches configured as anchor points for respective ones of the electrically conductive threads for holding and guiding the ones of the electrically conductive threads over and in contact with respective ones of the first conductive area and the second conductive area for providing the respective electrical connections while the mechanical connection by the thermoplastic layer with the textile fabric is established;

bringing a first conductive thread through the first notch and bringing a second conductive thread through the second notch;

positioning the device module onto the textile fabric with a middle part of each one of the first and the second conductive thread therein between while pulling respective ends of the conductive threads tight against the notches thereby guiding the each of the first and the second conductive thread over and in contact with a respective one of the first and the second conductive area;

applying pressure and/or heat to the device module and the textile fabric to establish a mechanical bonding between the device module and the textile fabric via the thermoplastic layer while enabling respective electrical contacts between ones of the first and the second conductive thread and respective ones of the first and the second conductive areas.

14. The method according to claim 13, wherein the first conductive thread is pulled tight between the respective notch in the circumference of the device module and a fixation provided the conductive thread being partially embedded in the textile fabric.

15. The method according to claim 13, wherein the first conductive thread is pulled tight between the respective notch in the circumference of the device module and a further guidance structure on the circumference of the device module.

* * * * *